(12) United States Patent
Bishop

(10) Patent No.: US 8,256,084 B1
(45) Date of Patent: Sep. 4, 2012

(54) METAL STENCIL COIN REPAIR METHOD

(75) Inventor: James M. Bishop, Colorado Springs, CO (US)

(73) Assignee: Your Dent Guy, Inc., Colorado Springs, CO (US)

( * ) Notice: Subject to any disclaimer, the term of this patent is extended or adjusted under 35 U.S.C. 154(b) by 454 days.

(21) Appl. No.: 12/689,810

(22) Filed: Jan. 19, 2010

Related U.S. Application Data

(60) Provisional application No. 61/147,120, filed on Jan. 25, 2009.

(51) Int. Cl.
*B23P 6/00* (2006.01)
*B21D 31/00* (2006.01)

(52) U.S. Cl. ............... 29/402.01; 29/402.19; 72/458; 72/479; 72/372

(58) Field of Classification Search ............ 29/402.01, 29/402.19; 72/372, 458, 478, 479, 705
See application file for complete search history.

(56) References Cited

U.S. PATENT DOCUMENTS

| | | | | |
|---|---|---|---|---|
| 1,196,942 A | | 9/1916 | Fraser | |
| 2,749,795 A | * | 6/1956 | Boykin, Jr. | 72/458 |
| 2,938,412 A | | 5/1960 | Walker | |
| 2,946,118 A | * | 7/1960 | Steck | 29/402.18 |
| 2,957,376 A | * | 10/1960 | Parisi | 72/458 |
| 3,100,336 A | * | 8/1963 | Fannin | 72/324 |
| 3,327,516 A | | 6/1967 | Anderson | |
| 3,776,828 A | * | 12/1973 | Ashworth et al. | 205/661 |
| 4,727,744 A | * | 3/1988 | Ferree | 72/466 |
| 5,445,000 A | * | 8/1995 | Brown | 72/31.01 |
| 5,461,900 A | | 10/1995 | Gutierrez | |
| 5,575,165 A | * | 11/1996 | Roseberry | 72/56 |
| 6,047,084 A | | 4/2000 | Kent et al. | |
| 6,440,615 B1 | | 8/2002 | Shimizu | |
| 6,543,270 B2 | | 4/2003 | Cmelik | |
| 6,641,865 B2 | | 11/2003 | Hertz | |
| 7,104,108 B2 | * | 9/2006 | Roche | 72/458 |
| 7,181,951 B1 | * | 2/2007 | Schmidt | 72/458 |
| 7,343,773 B1 | * | 3/2008 | Chan | 72/479 |
| 7,958,767 B2 | * | 6/2011 | Janversan | 72/459 |
| 2003/0005745 A1 | * | 1/2003 | Domino | 72/705 |
| 2003/0097869 A1 | * | 5/2003 | Meichtry | 72/705 |
| 2003/0101791 A1 | * | 6/2003 | Ritter | 72/705 |
| 2007/0056349 A1 | * | 3/2007 | Knowles | 72/705 |
| 2009/0049885 A1 | * | 2/2009 | Postma | 72/379.2 |
| 2010/0294016 A1 | * | 11/2010 | Barr | 72/429 |
| 2010/0294017 A1 | * | 11/2010 | Janversan | 72/458 |

FOREIGN PATENT DOCUMENTS

| | | | |
|---|---|---|---|
| JP | 2000100714 A | * | 4/2000 |
| JP | 2000122267 A | * | 4/2000 |
| JP | 2004241740 | | 8/2004 |

* cited by examiner

*Primary Examiner* — Essama Omgba
(74) *Attorney, Agent, or Firm* — Eric W Cernyar

(57) ABSTRACT

During the manufacture of printed circuit boards, metal stencils are used as a mask over which a blade is used to squeegee solder through stencil holes onto conducting pads of the circuit board. A typical stencil is both expensive and delicate. Even minor dents, creases, or impressions (commonly referred to as "coins") in the stencil can result in circuit board defects. Manufacturers frequently suffer significant losses scrapping their coined stencils and idling manufacturing lines while waiting for replacement stencils to be fabricated, shipped, and installed. An apparatus and method is provided for repairing metal stencil coins.

20 Claims, 11 Drawing Sheets

METAL STENCIL COIN REPAIR METHOD

RELATED APPLICATIONS

This application claims priority to and incorporates by reference my U.S. provisional application No. 61/147,120, filed Jan. 25, 2009, entitled "Metal Stencil Coin Repair Method."

FIELD OF THE INVENTION

The invention relates generally to paintless dent repair, and more particularly to several modifications of the tools and techniques of the trade to repair surface defects such as dents, creases, and impressions on solder stencils, especially framed metal stencils, used for solder paste printing of circuit boards.

BACKGROUND OF THE INVENTION

During the manufacture of printed circuit boards, metal foil stencils are used to deposit solder. The metal stencil serves as a mask over which a blade is used to squeegee solder through stencil holes onto conducting pads of the circuit board. A variety of background information about stencils can be found in U.S. Pat. Nos. 4,486,466; 4,893,403; 4,789,096; 4,976,813; 5,359,928; 5,493,075; 5,746,127; 5,800,856; 5,825,639; 5,984,166; 6,267,818; 6,273,327; 7,190,157; 7,220,975; 7,412,923; all of which are hereby incorporated by reference.

A typical stencil is very delicate. Stencils often range from between about 1.5 and 8 mils of thickness—and sometimes more and sometimes less. Many are made of stainless steel or a nickel alloy. Because stencils are so thin, they are very delicate and very easily damaged. Many stencils are framed to facilitate handling and mounting of the stencil without damaging the stencil. Other stencils are frameless and flexible, and can be rolled up like a street map.

A typical stencil—being custom made for a particular circuit board design—is also very expensive. Many cost thousands of dollars. To create the stencil, a laser is programmed to cut thousands of small, precisely-placed apertures to serve as the stencil holes. Each circuit board may require hundreds or thousands of solder points; and each stencil may be applied as a mask to multiple circuit boards simultaneously.

Even a minor dent, crease, or impression (commonly referred to as a "coin") in the stencil can result in circuit board defects. Manufacturers frequently suffer significant losses scrapping their coined stencils and idling manufacturing lines while waiting for replacement stencils to be fabricated, shipped, and installed.

Before this invention there was no process, known to the applicant, for repairing coined metal stencils. Rather, the normal practice in the industry is to simply dispose of the damaged stencils. Accordingly, there is a need for a method of repairing coins in stencils, in order to minimize the need to replace these expensive stencils and the losses associated with lengthy production line shutdowns.

SUMMARY OF THE INVENTION

Many years ago, the applicant, a paintless dent repair technician, was challenged to attempt to repair the coins in a metal stencil. The applicant's repair attempts at that time, using the normal tools and techniques of the paintless dent repair trade, failed. Because the metal stencils were extremely thin, attempts to repair a coin frequently resulted in greater damage. Moreover, applicant was unable to repair coins to satisfaction, that is, within the tolerance ranges required for solder application. Because applicant's efforts proved unsuccessful, the applicant temporarily discontinued those efforts.

Much more recently, the applicant approached the metal stencil manufacturer seeking an opportunity to renew his attempts. Over a period of several months and significant trial and error, applicant developed new tools and techniques to repair metal stencil coins. These new tools and techniques succeeded where the old tools and techniques failed, and applicant has now developed a successful and profitable method of repairing metal stencil coins.

Applicant's renewed efforts to repair metal stencil coins, which began in October 2008, led to a number of new tools and techniques, including the following:

(1) New tool tips for repairing coins. The tips first used in repair attempts were formed of metal and too sharply tipped. This would tend to scar the surface of the repair. Custom tips were developed made out of soft plastic or rubber and having various tip shapes, from sharp to very blunt, for different types of coins. These new tips give a technician much more control of how much surface area of the stencil is manipulated at one time, in order to avoid the scarring the stencil further.

(2) New hand tool for carrying tool tips. Many of the tools of the auto paintless dent repair business are very long, in order to provide the technician the necessary leverage to repair coins in the sheet metal. These tools provide far more leverage than is appropriate for stencil coins and are also difficult to manipulate with the delicacy and control needed for stencil coins. Repairing a damaged stencil takes a very steady hand. Applicant developed a new handle—a modification of a blank screwdriver handle. The new handle facilitates direct application (rather than a leveraged application) of pressure. It also facilitates far lighter and more delicate control of pressure.

(3) New and coin-type-specific pressure-application techniques. It is not necessary, in the paintless dent repair trade, to repair every cosmetic coin. But a far greater degree of perfection is required to repair a solder stencil. It is necessary to repair every critical defect on a solder stencil, or the repair effort is a wasted one. For a single critical defect left unrepaired or inadequately repaired will result in the scrapping of the stencil. Accordingly, the applicant developed procedures for repairing all areas of the metal stencils, including coins in the stencil holes or apertures, coins in the steps (clearance areas in the stencils), and restoring a smooth flat surface to all other surface areas on the stencil. Furthermore, many of the developed repair techniques involve repetitive motions not generally used in the paintless dent repair trade.

(4) Orientation of a straight-line light source to illuminate defects. Previously, applicant had attempted to illuminate the surface of the metal stencil with washed white lighting. The washed lighting, however, failed to reveal many defects that potentially interfered with the squeegee solder application. It also failed to provide adequate visual feedback when attempting to repair a coin. Repairing a damaged stencil requires not only a very steady hand, but also very good visual feedback and hand-eye coordination. After experimentation, applicant began using an adjustable stand-mounted straight-line light source to identify defects. Distortions in the reflected light pattern proved useful in both identifying defects, locating the proper place to apply tool tip pressure, and calibrating the amount of pressure to apply. For some stencil repairs, lines of different color tapes were applied to the light fixture and bulb to give a "straight edge" in the reflection. The lines on the light improved the ability to see more exact detail as the repair proceeded.

(5) Improved mounting of the stencil. Previously, applicant rested the frame on a table. In this position, it was difficult to manipulate the frame to detect a coin or make a needed repair. The frame was also susceptible to being bumped or displaced during a repair, which resulted in stencil damage. To better secure the stencil, and orient it into positions more convenient for inspection and repair, a collapsible frame was acquired and modified to secure the framed metal stencil. An apparatus was built to accommodate the frames on the stencils so they could be secured to the table using ratchet clamps.

(6) Use of a magnifying instrument. Again, in the paintless dent repair business, the goal is to remove cosmetic defects. Accordingly, there is no need to use a magnifying instrument to detect such defects. But the solder stencil business is primarily concerned with function, and even normally imperceptible coins can result in a failed or inadequate solder joint. Accordingly, applicant incorporated a magnifying instrument to detect and repair extremely small imperfections in the metal stencil.

Only a small percentage of initial attempts to repair stencil coins were successful. Also, the areas of the stencil that could be successfully repaired were initially limited. This proved unsatisfactory, for the stencil still had to be scrapped due to the unrepaired coins. Applicant's development of better tool tips, a modified handle, and significant methodological improvements resulted in a much higher, and commercially acceptable level, of repairs. With Applicant's invention, repairs can now be accomplished on any part of the surface area of the stencil. Applicant's invention even—and surprisingly—succeeds in repairing coins on the stencil holes or apertures. It also succeeds in repairing step coins and long, crease-like coins that extend the entire length of the stencil surface.

Applicant's modification and application of paintless dent repair techniques to the metal stencils is non-obvious for many reasons. First, the auto paintless dent repair business is a field and industry far removed from the circuit board fabrication business. Paintless dent repair is directed to fixing cosmetic defects on preformed coated sheet metals. Defects in solder stencils, by contrast, are functional, and often much smaller and visibly undetectable under normal lighting conditions. It is important to repair these defects to a degree and tolerance level to eliminate defects in the solder deposition process.

Second, paintless dent repair is applied to preformed coated sheet metals, whose composition, thickness and other properties are very different from the properties of a tensioned solder stencil. For example, metallic auto panels have a thickness ranging from 22-28 gauge (i.e., greater than about 12 mils, thick), plus a base coat of paint 5-8 mils thick and another clear coat of paint at least 5 mils thick. Products made of sheet metal can be bent and straightened under their own tension and thickness. By contrast, solder stencils often range from between 2 and 8 mils thickness—basically, they are as thin or thinner than, and often as delicate as, a piece of foil. They cannot be straightened under their own support.

Third, the tools and techniques typically used in the auto panel paintless dent repair business are not nearly delicate enough for repair of solder stencils. Indeed, the inventor's initial efforts to repair solder stencils with the typical tools and techniques of the auto paintless dent repair trade caused more damage than repair.

Fourth, far more perfection and consistency is required to salvage a solder stencil than to make satisfactory cosmetic repairs to an automobile body panel. While it may not matter if a few dings or coins on a car panel are left unrepaired, in the solder stencil business just a single remaining critical coin along the path of the squeegee renders the stencil worthless. It is not sufficient to repair all but one critical defect on a solder stencil. Rather, every critical defect must be repaired. Therefore, methods are needed to consistently repair a variety of different types of coins commonly encountered on solder stencils.

The invention has been successfully tested on creases as long as 14-18 inches across, coins less than one-eighth of an inch long or diameter, and coining damages as small as a barely visible speck of dirt surrounded by a small depression. It has been successfully applied to metal stencils with thicknesses less than 3 mils, and as little as 1 to 2 mils. Surface protrusions can be corrected to within a tolerance of 1 mil or less. Coins have been repaired to a tolerance level where they are no longer detectable by sight or touch. In short, the invention has been shown to work with the very smallest functional defects.

There is a long-felt need and significant advantages to the invention. Repairing coining damage on metal stencils saves time, expense and materials for manufacturers when any stencils are damaged because they will be able to do in house repairs instead of ordering a replacement stencil. With the inventive process repairs can be done on site in less than an hour using the existing damaged stencil in its frame mounting.

DETAILED DESCRIPTION

Figure 1:
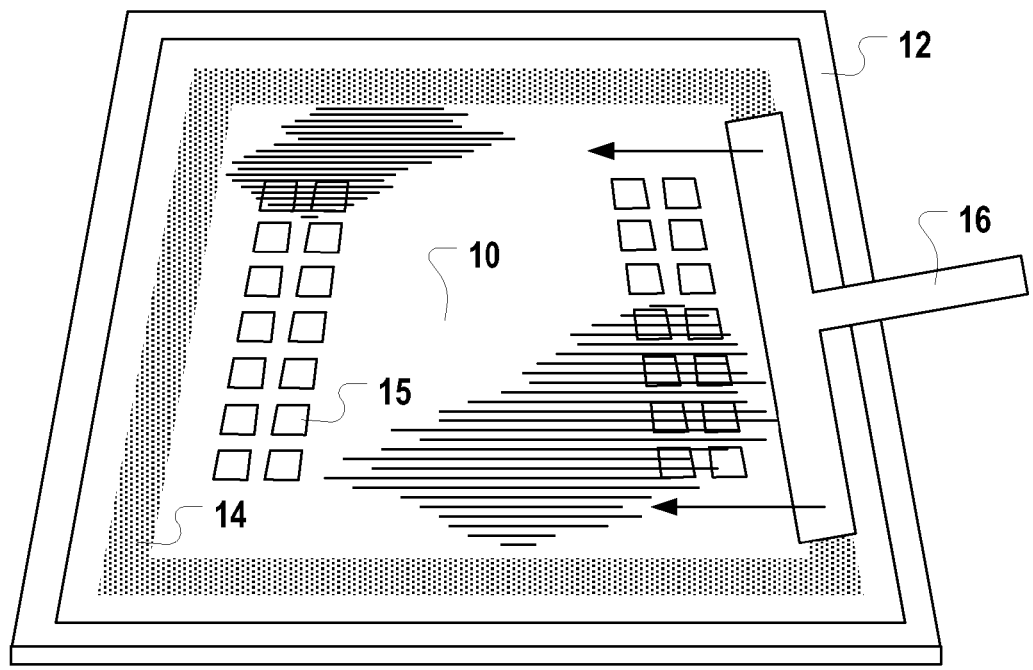
FIG. 1 is perspective view of a framed metal stencil illustrating a squeegee application of solder.

FIG. 1 illustrates one embodiment of a framed metal stencil 10. The metal stencil 10 is held in tension, at about 40-50 pounds of pressure, by metal stencil frame 12. The metal stencil 10 is glued to, and held taut, by screen 14. In some embodiments, the metal stencil 10 is made of stainless steel. In yet others, it is made of a brass alloy. Generally, the metal stencil 10 is moderately reflective, providing a moderately mirror-like reflection.

In operation, the metal stencil 10 is precisely positioned, as a mask, over a plurality of printed circuit boards. FIG. 1 illustrates a series of rectangles 15. Each rectangle 15 is positioned over a corresponding circuit board. Each rectangle 15 comprises hundreds of small circular holes or apertures (not shown because of their small relative size) through which solder is squeezed onto the conducting pads of the circuit board. FIG. 1 also illustrates the direction of travel of a squeegee 16 used to apply the solder.

Even small, relatively imperceptible coins or surface defects in the surface of the metal stencil 10, whether located in the rectangles 15 themselves or in the path of the squeegee 16, result in soldering defects. Frequently, several batches of circuit boards are soldered with resulting defects before a corresponding coin is identified in the metal stencil 10.

Figure 25:
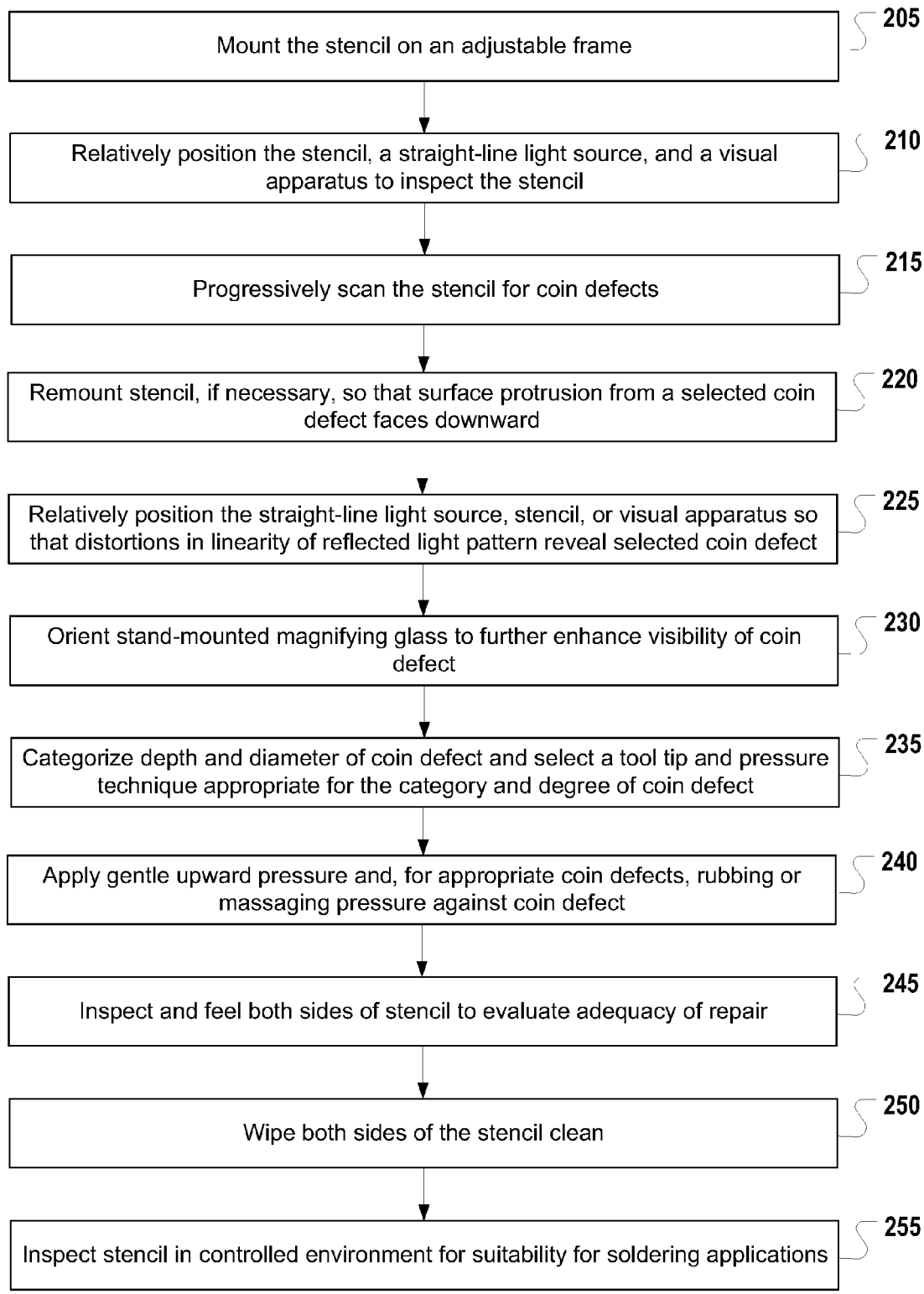
FIG. 25 is a flow chart illustrating several steps, some preferred and others optional or situation-specific, for identifying and repairing metal stencil coins.

The present invention is directed to methods and apparatus for detecting and repairing metal stencil coins. FIG. 25 is a flowchart of one embodiment 200 of such a method. The illustrated methodological embodiment 200 includes several optional steps, and the invention is intended to cover a broad array of methods that apply some, but fewer than all, of the illustrated steps. FIGS. 2-22 illustrate various embodiments of the apparatus, relative orientations, and motions used to carry out the invention.

In step 205, the metal stencil 10 is mounted in a substantially horizontal position on a wheeled frame, stand, or table 28. The wheeled stand 28 facilitates rapid repositioning of the metal stencil 10 for purposes of detecting and repairing coins on the metal stencil surface.

Figure 3:
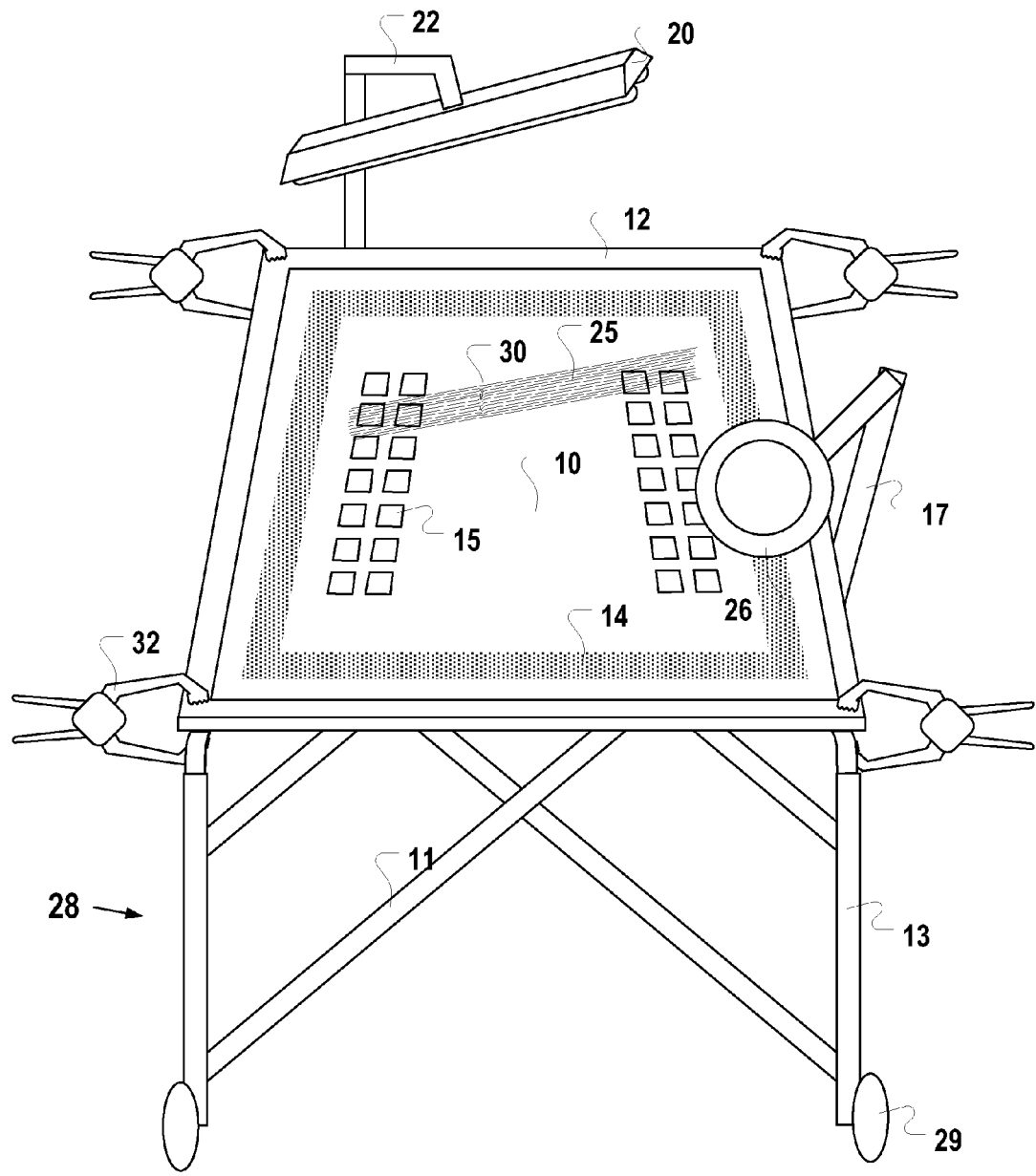
FIG. 3 is a perspective view of an apparatus for detecting and repairing metal stencil coins.
Figure 4:
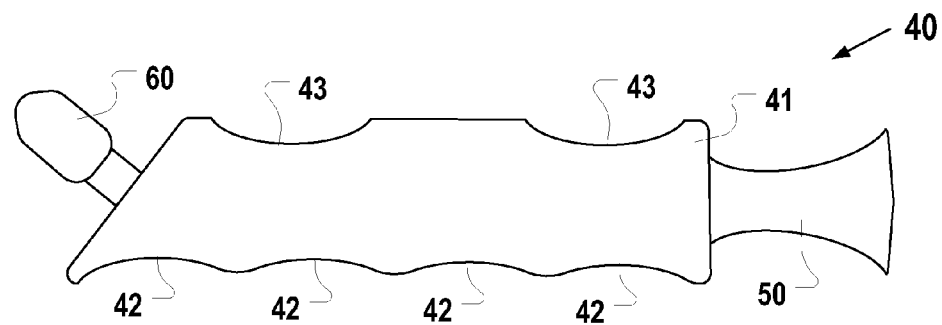
FIG. 4 is a side view of a handle tool with interchangeable tips for repairing metal stencil coins.
Figure 5:
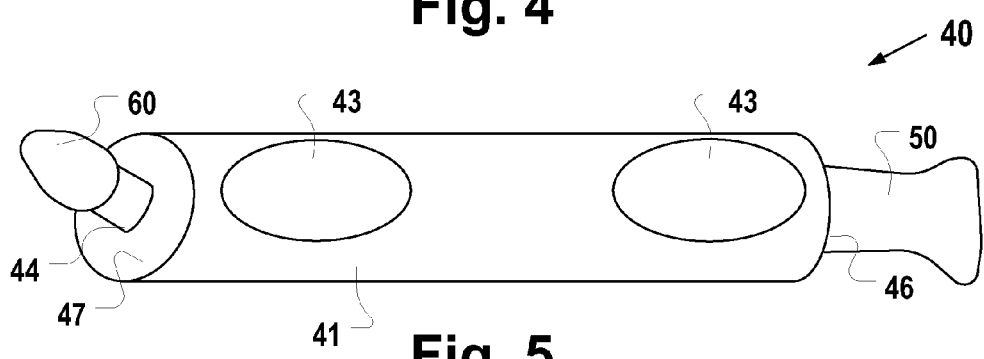
FIG. 5 is a perspective view of the handle tool of FIG. 4.

FIG. 3 illustrates a collapsible stand 28 that can be adjusted, via telescoping rods 11 and telescoping legs 13, to adjust to a preferred length, width, and height. In operation, the stand 28 should be adjusted to the length and width of the metal stencil frame 12, and ratchet clamps 32 used to hold the stencil frame 12 to the stand 28 securely so that leverage and pressure can be precisely applied to the stencil without it moving. The stand 28 should also be adjusted to a height that allows a technician—preferably while sitting, or alternatively while standing or kneeling—to place his or her chin adjacent the top surface of a mounted stencil.

The collapsible stand 28 optionally includes wheels 29 to facilitate fast repositioning of the table relative to a fixed light source. In this manner, the lighting can be adjusted by changing the position of the stencil mounting table. The table can also be rotated a few degrees at a time to view multiple angles under the reflection of the light to assess all areas of the stencil surface for smoothness and severity of any coined or damaged areas.

FIG. 3 also illustrates a straight-line light source 20—here, two elongated florescent tubes—that is mounted, via an adjustable light stand 22, to the collapsible stand 28. The light stand 22 comprises several articulating and pivotally-interconnected members, allowing the light source 20 to be positioned in a variety of orientations to facilitate coin detection and repair. The adjustable tube lighting can be moved to a position to provide an optimum viewing angle to perform repair process. FIG. 3 also illustrates a magnifying instrument 26 mounted via an articulating arm 17 to the stand 28.

Figure 11:
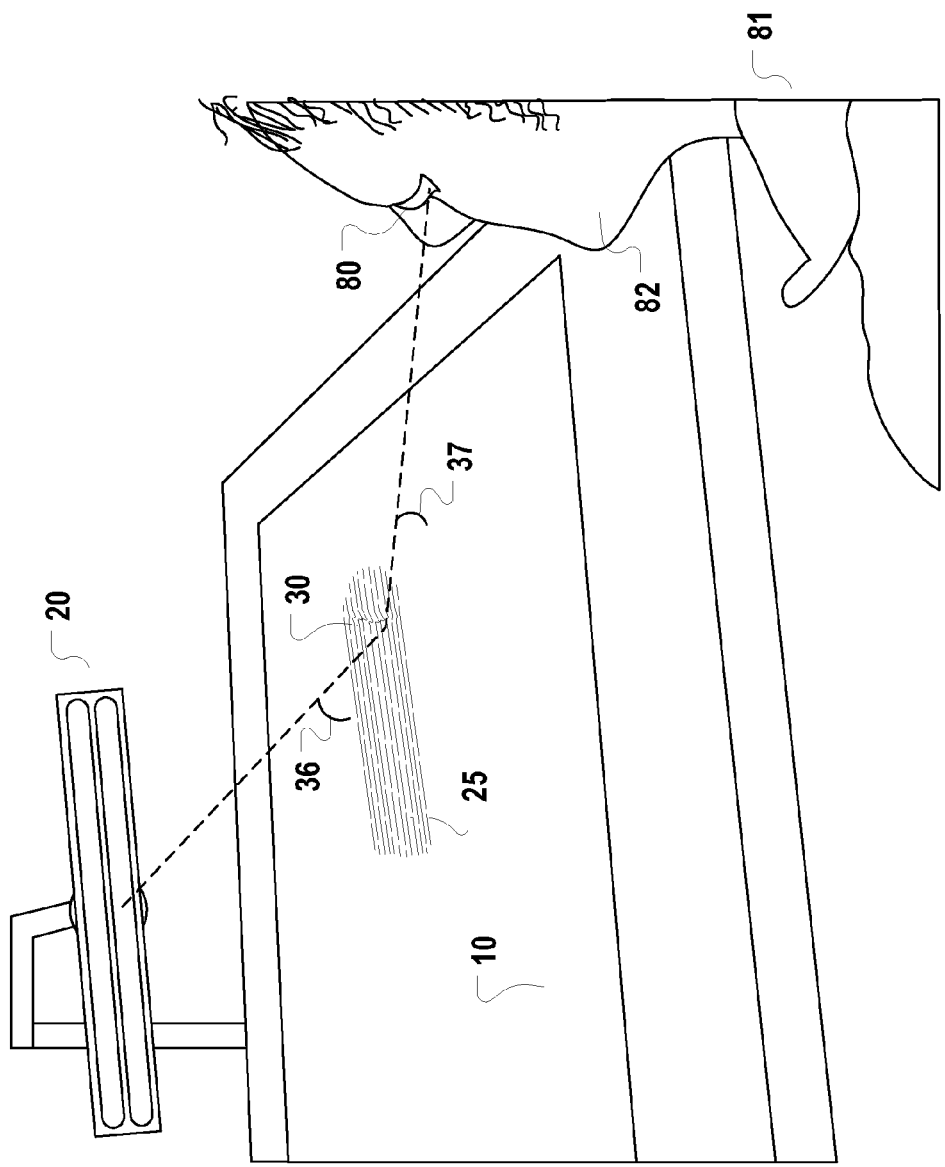
FIG. 11 is a perspective view illustrating a metal stencil, light source, and visual apparatus relatively positioned so that light from the light source reflects off of the metal stencil in the immediate vicinity of the defect toward the visual apparatus.

In step 210—which is best illustrated in FIG. 11—the metal stencil 10, a straight-line light source 20, and a visual apparatus 80 are relatively positioned so that a linear pattern of light 25 is reflected from the light source 20 off of the metal stencil 10 toward the visual apparatus 80.

The straight-line light source 20 preferably comprises a fluorescent tube or other elongated light fixture. Alternatively, the light source 20 may comprise a plurality of linearly-arrayed non-linear light sources or a single non-linear light source whose light is filtered, channeled, and/or reflected to provide a straight-line source of illumination. Sometimes, it is helpful to also apply strips of translucent color tapes or masks to the light source to provide a "straight edge" in the reflected light. The visual apparatus 80 preferably consists of a pair of human eyes, but alternatively comprises a camera, light detector array, or other imaging device.

The relative positioning of step 210 causes light from the light source to reflect in a generally linear pattern 25, extending to the right and left of center, off of the metal stencil 10. Observed distortions in the linearity of the reflected light pattern 25 reveal otherwise generally imperceptible defects. Looking for nonlinear distortions or irregularities in the reflected pattern of light 25 is also useful for pinpointing where the technician is applying corrective pressure. The degree of observed nonlinear distortion is useful for calibrating the amount of pressure needed or actually applied to the coin or in the area immediately surrounding the coin.

In step 215, the metal stencil 10 is progressively inspected or scanned, using this defect-detection-enhancing technique, for coins. The metal stencil 10, the straight-line light source 20, and the visual apparatus 80 are repeatedly re-positioned to progressively reposition the observed linear pattern of light 25 over the entire critical area (the area of the stencil 10 over which the squeegee 16 travels) of the metal stencil 10. This may be accomplished by moving the visual apparatus 80 and changing the selected position of the light source through multiple positions to inspect the stencil for coins. This may be alternatively or additionally accomplished by moving a stand 28 on which the framed metal stencil 10 is mounted through multiple positions in order to inspect the metal stencil 10 for coins. When a defect is observed, it is optionally marked with a non-permanent marker.

The repair process for a detected coin begins with step 220. In step 220, the technician identifies the direction in which a surface protrusion of a detected coin is facing. Also, the metal stencil is remounted, if necessary, so that the defective surface protrusion is facing downward.

Figure 2:
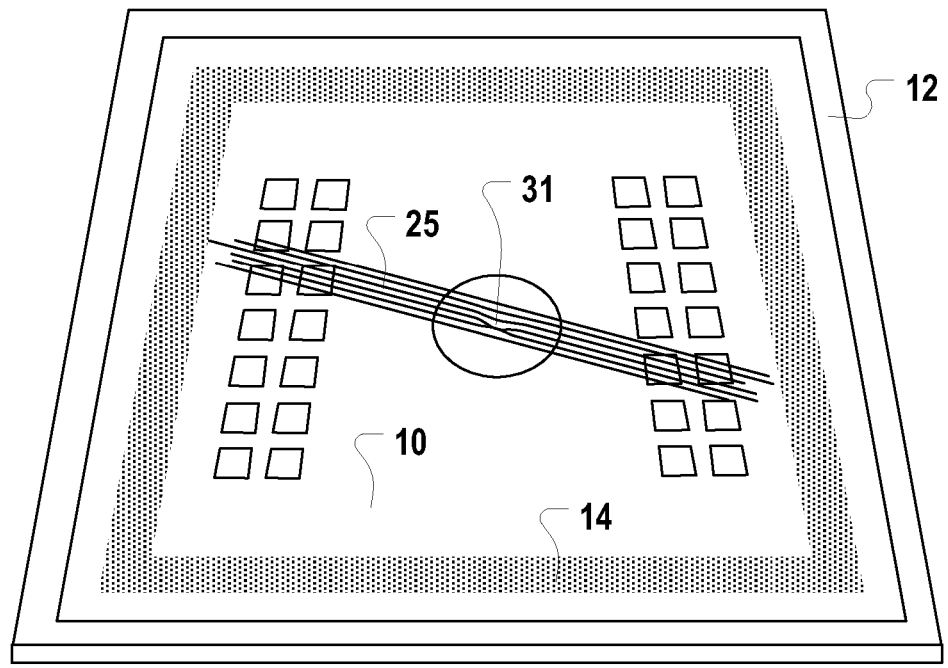
FIG. 2 is a perspective view of a framed metal stencil with a small sharp coin, revealed by light reflected from a straight-line light source, in the path of the squeegee.

Step 225 is a more particular repeat of step 210, with the metal stencil 10, straight-line light source 20, and a visual apparatus 80 relatively positioned to position the reflected light pattern 25 on and to the right and left of a previously identified coin. In one embodiment, this accomplished by repositioning the straight-line light source 20 to project its light at an angle toward the metal stencil coin so that it reflects off of the coin in the direction of the visual apparatus. In another embodiment, this is accomplished by rolling and re-orienting the stand 28 to a different location relative to the light source 20. In yet another embodiment, this is accomplished by repositioning the visual apparatus 80. In any event, the angle of incidence 36 at the location of the metal stencil coin between the incoming light and the plane of the metal stencil 10 is approximately equal to the angle of reflection 37, relative to the same plane, toward the visual apparatus 80. FIGS. 2, 3, and 11 all illustrate coins 30 or 31 illuminated by a straight-line light reflection pattern 25.

In step 230, a frame-mounted magnifying instrument 26 (FIG. 3), preferably a magnifying glass, is positioned between the defect and the visual apparatus to further enhance the detectibility of the defective surface protrusion.

In step 235, the technician determines or categorizes the depth and diameter of the detected coin and selects a tool tip and pressure technique appropriate for that category or degree of coining damage. The extent to which the reflected light pattern is distorted provides a good indication of the length, size and depth of the coin. Preferably, a hand tool with a polymer or polymer-coated tip is selected that is adapted to press and rub away the surface protrusion to below a tolerance specification needed for squeegee solder applications. FIGS. 4-10, discussed further below, illustrate a handheld stencil repair tool 40 with a variety of customized tips useful in repairing different types of metal stencil coins.

In step 240, the technician gently presses a polymerized or polymer-coated tool tip up and against the surface protrusion on the metal stencil, while observing the location and degree of distortions in the reflected light caused by the pressure application. The technician conditions both the location and the amount of applied pressure upon the observed location and observed degree of distortions in the reflected light. Depending on the type of coin encountered, the technician may also gently nip the tool tip up and against the surface protrusion of the coin, and in the immediate surroundings of the surface protrusion, to repair the coin.

Figure 12:
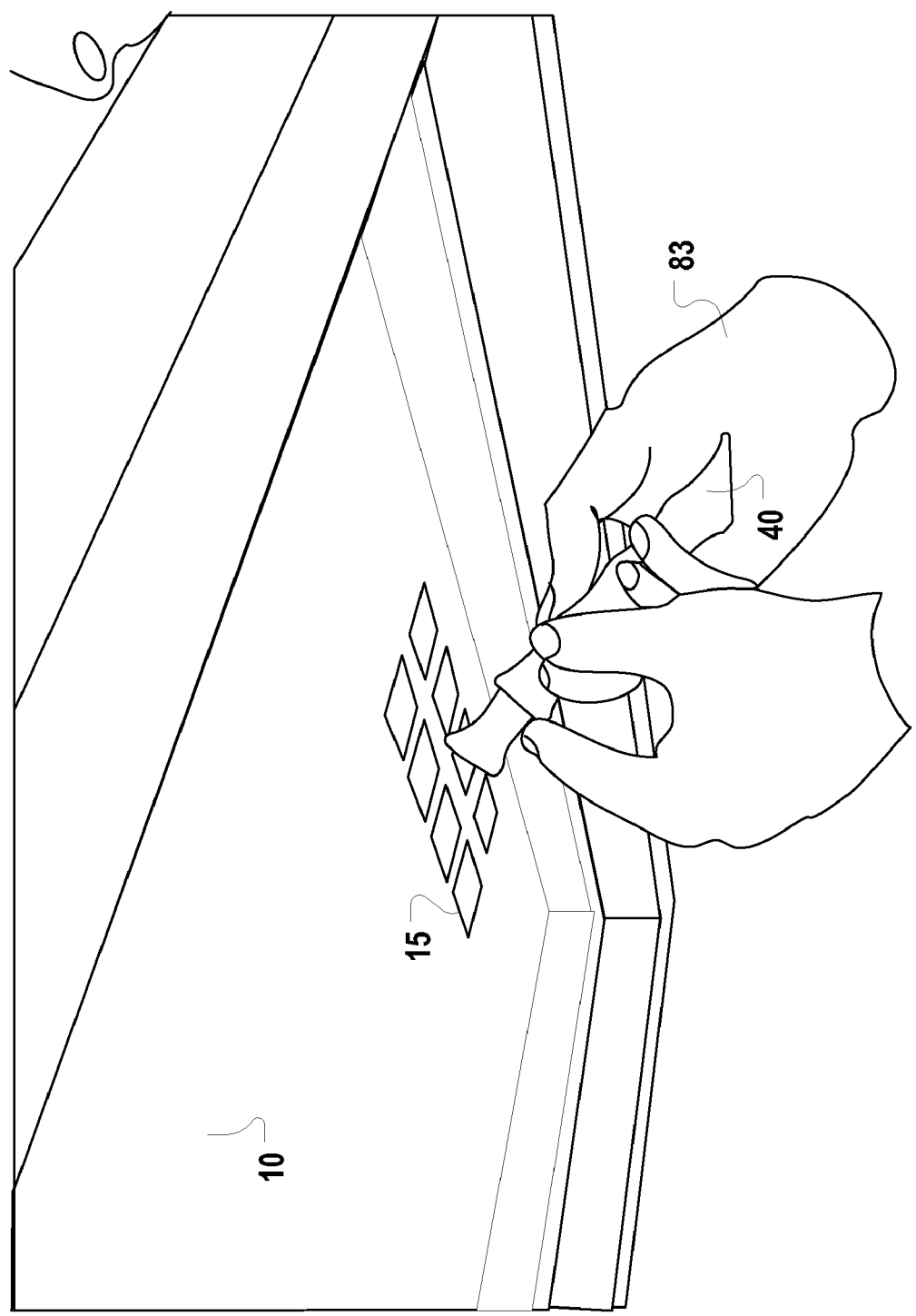
FIG. 12 is a perspective view illustrating the step of positioning a person's chin adjacent a top surface of the metal stencil while positioning at least one of the person's hands underneath the mounted metal stencil to hold and manipulate a hand-held tool carrying the tool tip to repair the defect.

Because the metal stencil 10 is so thin, considerable control and finesse is needed to repair a coin without further damaging the metal stencil 10. FIG. 11 illustrates a technician 81 positioning his or her chin 82 adjacent a top surface of the metal stencil frame 12 to steady his or her gaze while massaging a coin 30. FIG. 12 illustrates the technician simultaneously holding and carefully manipulating a handheld stencil repair tool 40 with both hands beneath the metal stencil frame 10 in order to apply gentle massaging pressure to the coin 30.

In step 245, the technician inspects and feels, with his or her finger(s), the stencil to evaluate whether the repair is adequate and whether the surface in the area of the previously-detected coin is substantially flat and free of defects. After this inspection process is done on one side of the stencil, the stencil is flipped and remounted and the same inspection is done on the opposite side. The technician may, if necessary, apply pressure from the opposite side of the stencil using the same techniques described in steps 220-240.

After the repairs are complete and initially determined to be acceptable, then in step 250, the technician wipes and cleans both sides of the stencil with a micro fiber cloth or paper product wetted with a 90% rubbing alcohol solution.

In step 255, the repaired stencil goes through quality control where it is inspected in a controlled environment. A laser may be used to detect whether any surface displacements are within tolerance specifications.

The steadiness, gentleness, and control needed to repair a solder stencil also calls for a better tool than the tools typically used in the paintless dent repair trade. FIGS. 4-10 illustrate a stencil repair tool 40 custom designed to facilitate the techniques of the present invention. The stencil repair tool 40 includes a generally cylindrical cushioned handle 41 that bears some resemblance to a blank screwdriver handle. Four oval depressions or finger holds 42 are lined up on one side of this custom-made handle 41. Two more oval depressions or thumb holds 43 are lined up on the opposite side of the handle 41. The handle 41 is about four to five inches in length, with a 90-degree end 46 and a 45-degree end 47. An internally threaded bore 44 is provided in each end 46 and 47 for mounting a correspondingly externally threaded tool tip. The 90-degree end 46 holds a tool tip parallel to the longitudinal direction of the handle 41. The 45-degree end 47 holds a tool tip at a 45-angle to the longitudinal direction of the handle 41.

Figure 6:
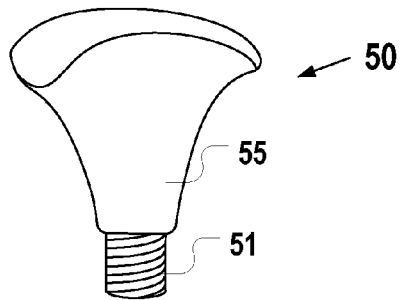
FIG. 6 is a perspective view of a customized tool tip, with a sharp tip, a blunt tip, and a rounded smooth side for repairing metal stencil coins.
Figures 7, 8:
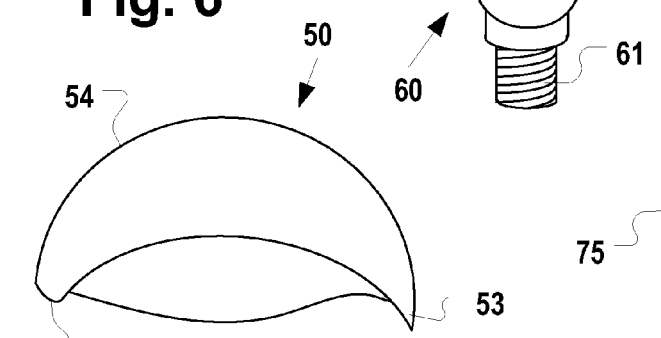
FIG. 7 is a top view of the customized tool tip of FIG. 6.
FIG. 8 is a perspective view of another tool tip for the handle tool of FIGS. 3-4.

FIGS. 6 and 7 illustrate a customized crescent tool tip 50 especially developed for stencil repair. The crescent tool tip 50 has a carved or molded plastic body 55 mounted on an externally threaded attachment shaft 51. The body 55 is preferably made of acetal plastic, a thermoplastic produced by the addition polymerization of an aldehyde through the carbonyl function, having a hardness, measured on the Rockwell M scale, of between 89 and 94.

The body 55 tapers from a generally small-diameter cylindrical cross section to a much broader-diameter crescent-shaped top that provides a blunt tip 52, a sharp tip 53, and a rounded smooth side 54. The span between the blunt and sharp tips 52 and 53 is approximately 2.3 cm. The width of the body 55 is about 1 cm and the length of the body is about 2.8 cm. The variety of pressure application surfaces 52-54 make the crescent tool tip 50 versatile enough to repair most solder stencil coins.

Figure 14:
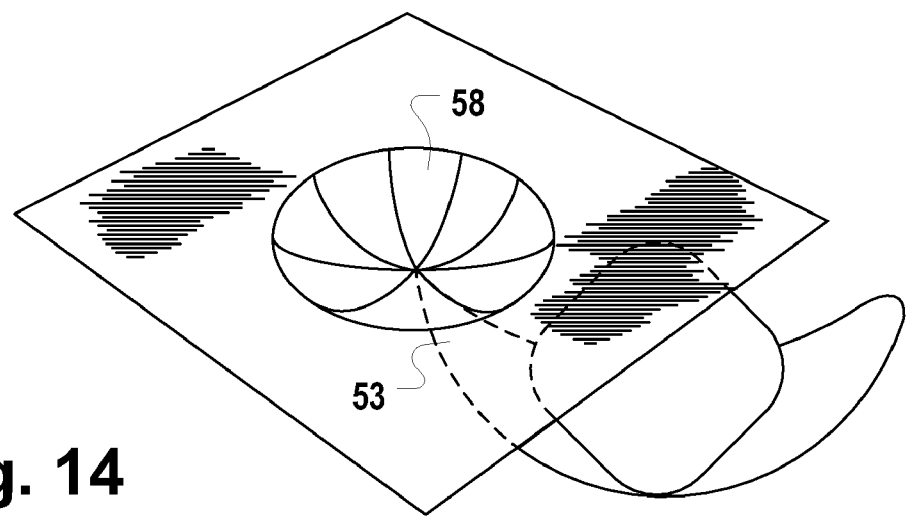
FIG. 14 illustrates the positioning of a sharp tip to repair a small-diameter metal stencil coin.
Figure 15:
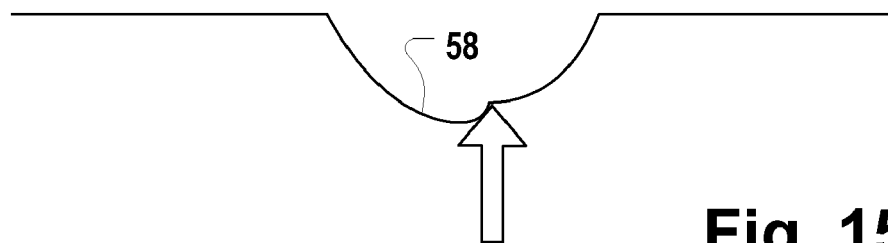
FIG. 15 is a side view illustrating the gentle upward application of pressure to repair a small-diameter metal stencil coin.

The sharp tip 53 is best suited for applying firm, straight upward pressure against small, barely perceptible coins, located in the non-aperture section of a stencil, with a tight center in the lowest part of the coin. FIGS. 14 and 15 illustrate the sharp tip 53 of the crescent-shaped tool 50 being used to apply straight upward pressure against a small, tight-centered coin 58. FIG. 14, in particular, is not to scale, but exaggerates the size of the coin 58. When a small coin 58 is located on or adjacent a solder aperture (e.g., in one of the rectangles 15), it is better to use the blunt tip 52, because care must be taken not to create a jagged edge on the apertures.

Figure 13:
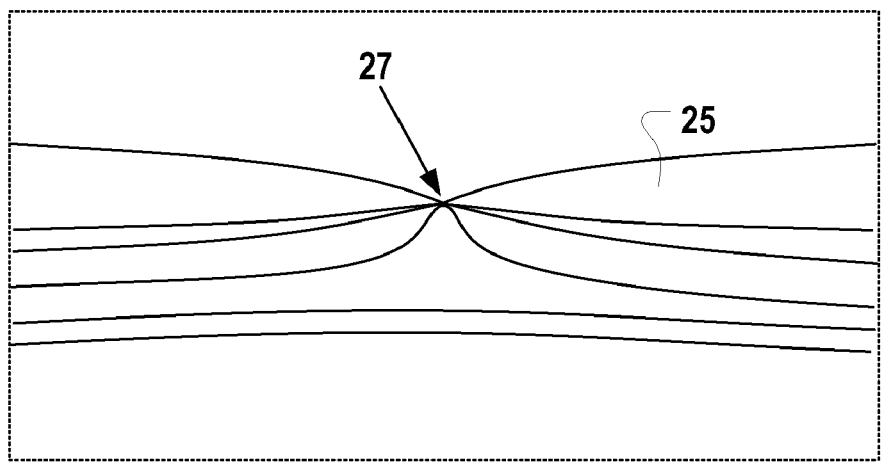
FIG. 13 illustrates a distortion, caused by upwardly-applied pressure against a point on the bottom surface of a framed metal stencil, in a light pattern reflected off of the stencil's top surface from a linear light source.

When addressing a small, sharp-centered coin 58, the pressure should applied as close to the exact center of the coin 58 as possible. Because of the coin's small size, this is a difficult practice to master. To assist in that process, the technician should carefully observe the distortions in the reflected light pattern 25 caused by application of the tool tip pressure. FIG. 13 illustrates converging distortions 27 in a reflected light pattern 25 off of the top surface of a solder stencil 10 caused by application of tool tip pressure up and against the bottom surface of the solder stencil 10.

Figure 16:
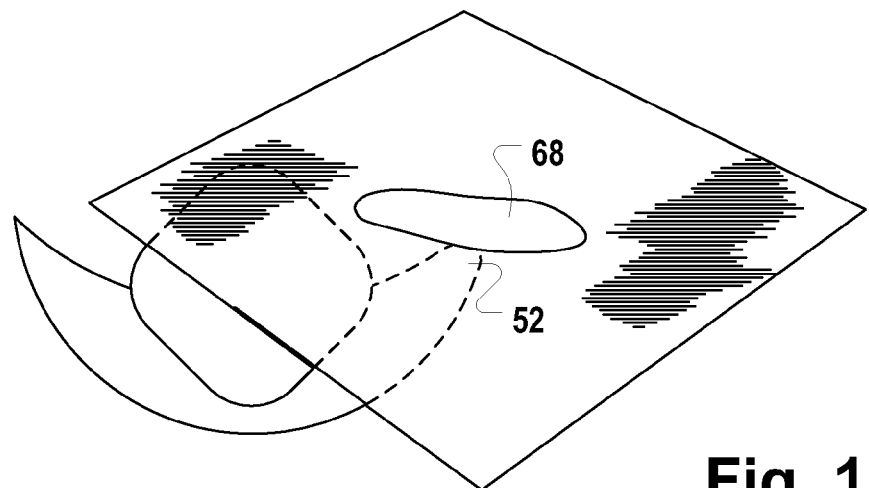
FIG. 16 illustrates the positioning of a blunt tip to repair a large-diameter metal stencil coin.
Figure 17:
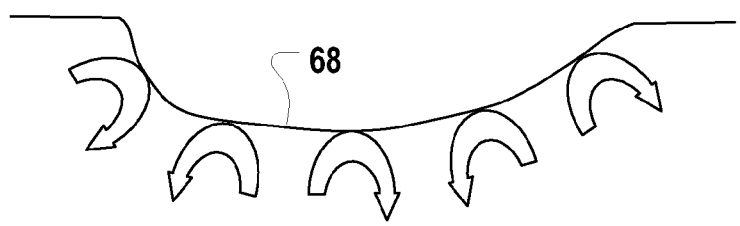
FIG. 17 is a side view illustrating the gentle upward and lateral, massage-like application of tool-tip pressure to repair a large-diameter metal stencil coin.
Figure 18:
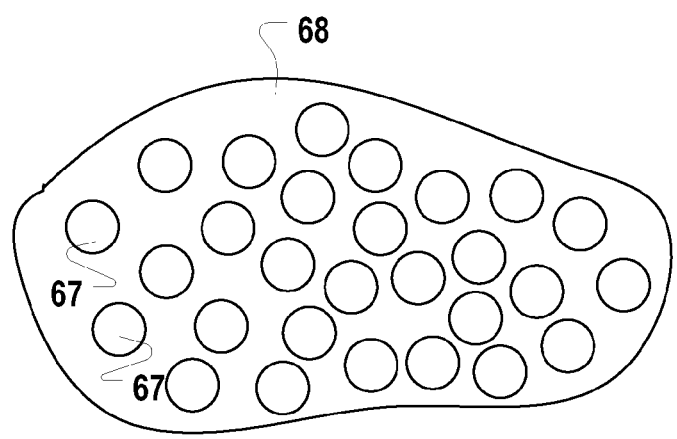
FIG. 18 illustrates a multiplicity of points along a larger metal stencil coin where tool-tip pressure is applied to repair a large-diameter metal stencil coin.
Figure 19:
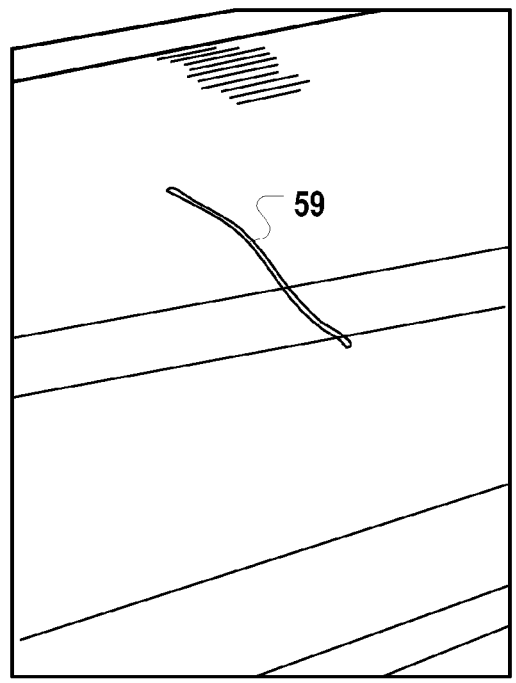
FIG. 19 illustrates a crease or line coin in the surface of a framed metal stencil.
Figure 20:
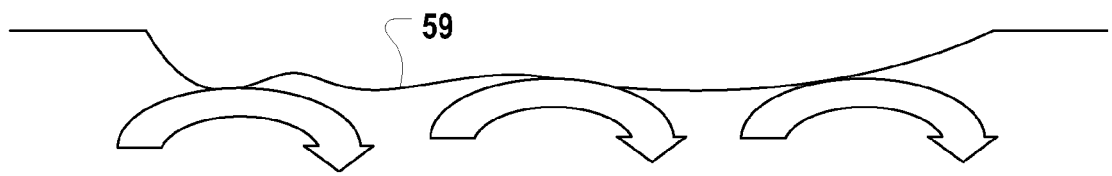
FIG. 20 illustrates the rubbing motion, in the direction of the crease, used to repair a crease or line coin in the surface of a framed metal stencil.

The blunt tip 52 is best suited for repairing larger-diameter coins. FIGS. 16-18 illustrate the blunt tip 52 of the crescent-shaped tool 50 being used to apply gentle upward and lateral, massage-like tool-tip pressure to repair a large-diameter metal stencil coin 68. To repair a large-diameter coin 68, the blunt tip 52 should be pressed against several different places 67 in the deepest part of the coin 68, to gradually and incrementally smooth out the surface protrusion as evenly and smoothly as possible. Note that in FIG. 17, this process also involves pressing the blunt tip 52 at different angles for different points, relative to the plane of the stencil 10, to substantially eliminate the detected coin.

The rounded smooth side 54 is best suited for creases, which may have many different shapes and lengths. FIGS. 3, 11, 19 and 20 illustrate creases 30 and 59. Creases are best addressed by using a gentle direct rubbing motion in the direction of the crease, working from one end to the other (that is, not starting in the middle).

FIG. 8 illustrates a rounded knob-shaped tool tip 60 having a soft plastic body 65 mounted on an externally threaded attachment shaft 61. The body 65 is preferably made of acetal plastic having a hardness, measured on the Rockwell M scale, of between 89 and 94. Tool tip 60 is particularly suited for repairing shallow solder stencil coins that have no sharp center or crease.

Figure 9:
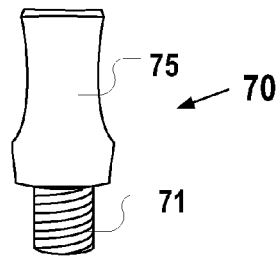
FIG. 9 is a perspective view of yet another customized tool tip for the handle tool of FIGS. 3-4.
Figure 10:
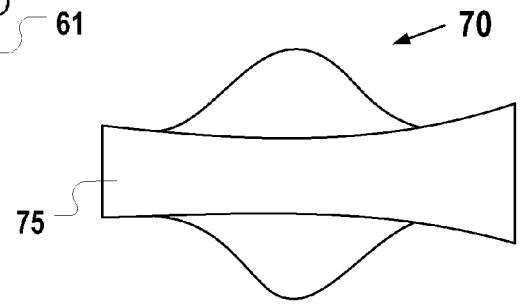
FIG. 10 is a top view of the customized tool tip of FIG. 9.
Figure 21:
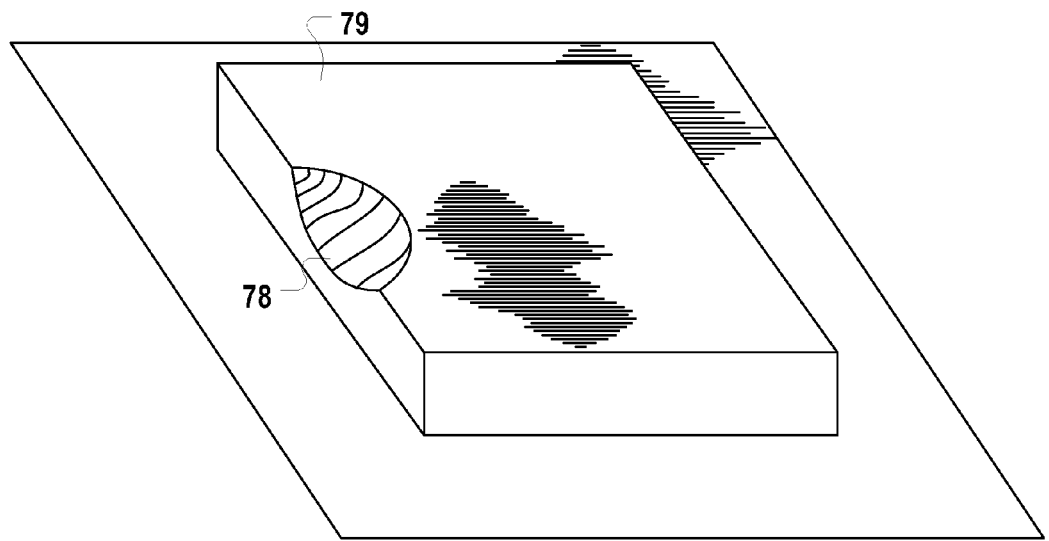
FIG. 21 illustrates a step coin in a framed metal stencil.
Figure 22:
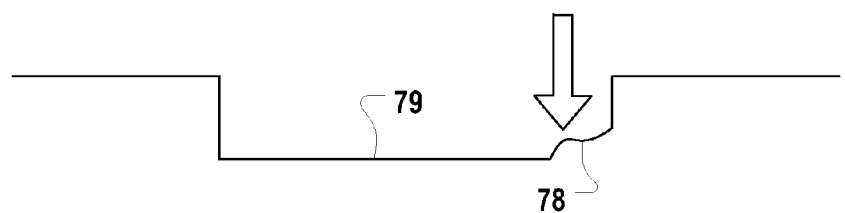
FIG. 22 illustrates the downward application of pressure to repair a step coin.

FIGS. 9-10 illustrate a substantially-flat-but-slightly-concave-sided, flat-head tool tip 70 having a body 75 mounted on an externally threaded attachment shaft 71. The body 75 is preferably made of a plastic having a hardness, measured on the Rockwell M scale, of between 66 and 69. Tool tip 70 is particularly suited for repairing coins located in a stencil step. A step is an area in the solder stencil that allows clearance for electrical components on the surface of the printed circuit board. FIGS. 21 and 22 illustrate a step 79 with a coin defect 78 along an edge or corner. The flat tips of the tool tip 78 are well-suited to repairing bent-edge step coins.

Developing the steadiness, gentleness, and control needed to repair a solder stencil also requires practice. The amount of pressure needed to repair a defect depends on the thickness of the stencil and the overall depth of the coining damage. Pressing just enough to correct the coining defect, and not so hard as to cause more damage, is key to a successful repair.

Figure 23:
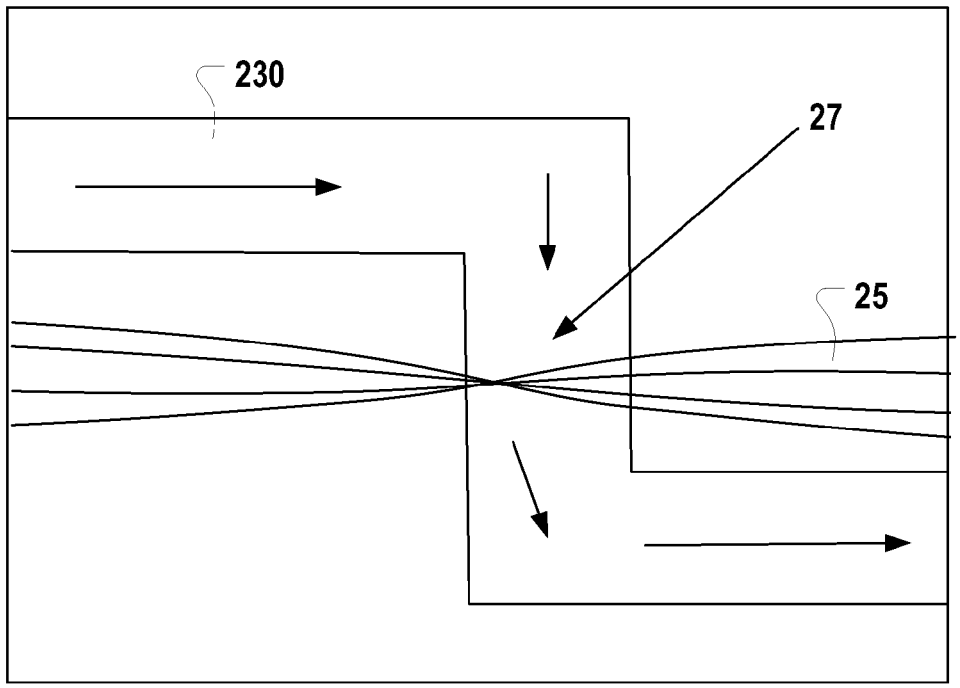
FIG. 23 illustrates a maze technique for training a technician in the delicate art of repairing metal stencil coins.
Figure 24:
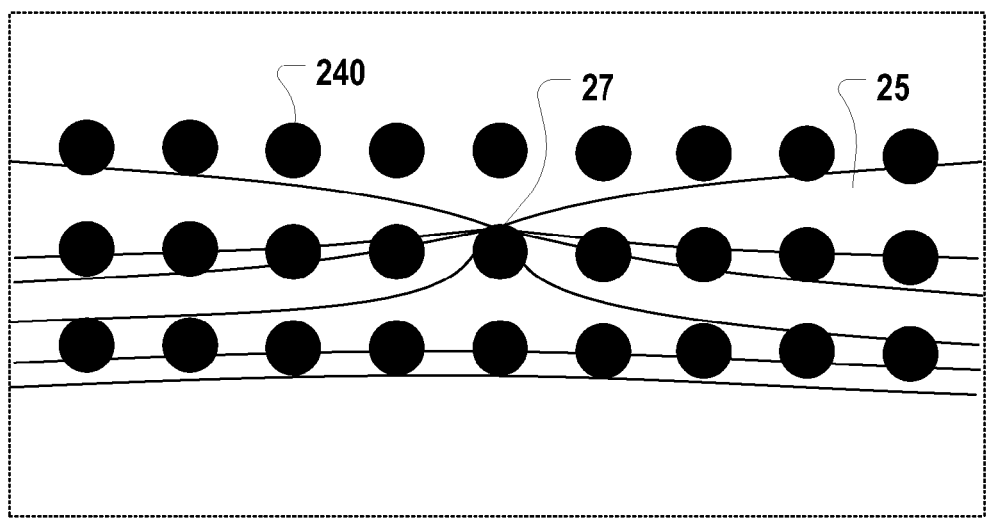
FIG. 24 illustrates a dot technique for training a technician in the delicate art of repairing metal stencil coins.

FIGS. 23 and 24 illustrate two teaching techniques for training a technician in this delicate art. In FIG. 23, a maze 230 is superimposed (e.g., using a marker) over a stencil 10. The technician applies gentle tool tip pressure against the underside of the stencil 10 between the maze lines. The technician moves the tool tip along the direction of the maze arrows, the entire time locating the position of the tool tip through observation of the converging distortion lines 27 in the reflected light pattern 25.

In FIG. 24, a plurality of very small dots are drawn (again using a marker) on a stencil 10. In FIG. 24, the size of the dots are exaggerated for effect. The technician presses a tool tip against the underside of the stencil 10, attempting to consistently press the stencil at the center of each dot. Again, the technician observes the converging distortion lines 27 in the reflected light pattern 25 to identify the location of the tool tip. If the tool tip is positioned at the center of a dot, then the observed distortion lines 27 should converge at the center of the dot.

Having thus described exemplary embodiments of the present invention, it should be noted that the disclosures contained in FIGS. 1-25 are exemplary only, and that various other alternatives, adaptations, and modifications may be made within the scope of the present invention. Accordingly, the present invention is not limited to the specific embodiments illustrated herein, but is limited only by the following claims.

I claim:

1. A method for repairing a defective surface protrusion on a metal stencil used in applying solder paste to a circuit board, the method comprising:
    mounting the metal stencil so that the defective surface protrusion is facing downward;
    enhancing the detectibility of the defective surface protrusion by relatively positioning the metal stencil, a light source, and a visual apparatus, so that light from the light source reflects off of the metal stencil in the immediate vicinity of the defective surface protrusion toward the visual apparatus;
    gently pressing a polymerized or polymer-coated tool tip up and against the surface protrusion on the metal stencil;
    observing the location and degree of distortions in the reflected light while pressing the polymerized or polymer-coated tool tip up and against the surface protrusion; and
    conditioning both the location and the amount of applied pressure upon the observed location and observed degree of distortions in the reflected light.

2. The method of claim 1, further comprising the step of positioning a person's chin adjacent a top surface of the metal stencil while positioning at least one of the person's hands underneath the mounted metal stencil to hold and manipulate a hand-held tool carrying the tool tip to repair the defective surface protrusion.

3. The method of claim 1, further comprising the step of relatively positioning a frame-mounted magnifying instrument between the defective surface protrusion and the visual apparatus to further enhance the detectibility of the defective surface protrusion.

4. The method of claim 1, further comprising gently rubbing the tool tip up and against the surface protrusion.

5. The method of claim 1, further comprising gently pressing the tool tip up and against the metal stencil around the surface protrusion.

6. The method of claim 1, further comprising pressing the tool tip up and against multiple points of the surface protrusion to gradually and incrementally smooth out the surface protrusion.

7. The method of claim 1, wherein the light source is a straight-line light source, further comprising relatively positioning the metal stencil, the light source, and the visual apparatus so that light from the light source reflects off of the defective surface protrusion and, from the perspective of the visual apparatus, to the right and left of the defective surface protrusion, so that distortions in the linearity of the reflected light pattern reveal the defective surface protrusion.

8. The method of claim 1, wherein the light source is a selectively projectable light source, and the step of relative positioning includes projecting the light source toward the defective surface protrusion in the metal stencil, at an angle, so that its reflection is in the direction of the visual apparatus.

9. The method of claim 1, further comprising the step of providing a customized hand tool with a polymer or polymer-coated tip to press and rub and substantially eliminate the surface protrusion, wherein substantial elimination of the surface protrusion is accomplished when a measure of a displacement of the surface protrusion is reduced below a tolerance specification.

10. The method of claim 1, the method further comprising the step of changing a selected position of the light source through multiple positions to inspect the stencil for coins.

11. The method of claim 1, the method further comprising the step of mounting the stencil on a wheeled repair stand to facilitate adjusting the position of the stencil in relation to the light source, the method further comprising the step of moving the wheeled repair stand through multiple positions in order to inspect the stencil for coins.

12. The method of claim 1, further comprising the step of applying strips of translucent color tapes or masks to the light source to provide a "straight edge" in the reflected light.

13. A method for repairing a defective surface protrusion on a metal stencil used in applying solder paste to a circuit board, the method comprising:
  enhancing the detectibility of the defective surface protrusion by relatively positioning the metal stencil, a straight-line light source, and a visual apparatus, so that light from the straight-line light source reflects off of the metal stencil in the immediate vicinity of the defective surface protrusion toward the visual apparatus, and so that distortions in the linearity of the reflected light pattern reveal the defective surface protrusion;
  gently pressing a polymerized or polymer-coated tool tip up and against the surface protrusion on the metal stencil;
  observing the location and degree of distortions in the reflected light while pressing the polymerized or polymer-coated tool tip up and against the surface protrusion; and
  conditioning both the location and the amount of applied pressure upon the observed location and observed degree of distortions in the reflected light.

14. A method for repairing a damaged framed metal stencil used in applying solder paste to a printed circuit board, the method comprising:
  mounting the frame of the framed metal stencil to a repair stand;
  selectively directing light from a light source positioned at a selected location and at a selected angle to the stencil;
  inspecting the stencil for coins by observing distortions in reflections of the selectively directed light;
  selecting a repair tip for a handle tool having interchangeable tips, the repair tip having a shape, sharpness, bluntness, and depth appropriate for repairing a detected coin;
  repairing the selected coin by pressing the handle tool at a selected location of the stencil and at a selected angle to the stencil to substantially eliminate the detected coin; and
  viewing the stencil on both sides to evaluate whether the repair was adequate and the surface in the area of the previously-detected coin is substantially flat and free of blemishes.

15. The method of claim 14, further comprising the steps of determining the depth and diameter of the detected coin.

16. The method of claim 14, further comprising the step of adjusting the selected position of the light source to identify an appropriate location on the stencil to which pressure is to be applied to repair the coin.

17. The method of claim 14, wherein the repair stand is a collapsible repair stand, the method further comprising the step of adjusting the width of the collapsible repair stand to a width approximately equal to a width of the framed metal stencil.

18. The method of claim 14, further comprising the step of marking the location of the coin on the stencil.

19. The method of claim 14, further comprising the step of securing the framed metal stencil to the repair stand using ratcheting clamps.

20. The method of claim 14, further comprising the steps of identifying a direction in which a surface protrusion of a detected coin is facing, and re-mounting the metal stencil so that the defective surface protrusion is facing downward.

* * * * *